US 11,508,808 B2

(12) United States Patent
Li et al.

(10) Patent No.: US 11,508,808 B2
(45) Date of Patent: Nov. 22, 2022

(54) RECTIFIER DEVICE, RECTIFIER, GENERATOR DEVICE, AND POWERTRAIN FOR VEHICLE

(71) Applicant: ACTRON TECHNOLOGY CORPORATION, Taoyuan (TW)

(72) Inventors: Hong-Dao Li, Taoyuan (TW); Yu-Jen Shen, Taoyuan (TW); Hung-Chun Fan, Taoyuan (TW); Shih-Hsin Ying, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 16/452,563

(22) Filed: Jun. 26, 2019

(65) Prior Publication Data

US 2020/0119140 A1    Apr. 16, 2020

Related U.S. Application Data

(60) Provisional application No. 62/744,138, filed on Oct. 11, 2018.

(30) Foreign Application Priority Data

Apr. 17, 2019    (TW) .................................. 108113456

(51) Int. Cl.
*H01L 29/06* (2006.01)
*H01L 29/78* (2006.01)
*H02M 7/217* (2006.01)

(52) U.S. Cl.
CPC ...... *H01L 29/0619* (2013.01); *H01L 29/7827* (2013.01); *H02M 7/217* (2013.01)

(58) Field of Classification Search
CPC . H01L 29/0619; H01L 29/7827; H01L 24/32; H01L 24/33; H01L 2224/29116;
(Continued)

(56) References Cited

U.S. PATENT DOCUMENTS 4,443,493 A * 4/1984 Delfino ............... H01L 21/3105
                                                    219/121.65
6,186,408 B1 * 2/2001 Rodov ................ H01L 27/0814
                                                    238/268

(Continued)

FOREIGN PATENT DOCUMENTS

JP    S57194561    11/1982
JP    2005045905    2/2005

(Continued)

OTHER PUBLICATIONS

"Office Action of Japan Counterpart Application", dated Oct. 20, 2020, p. 1-p. 7.

(Continued)

*Primary Examiner* — Wasiul Haider
(74) *Attorney, Agent, or Firm* — JCIPRNET

(57) ABSTRACT

Provided is a rectifier device for a vehicle alternator including a rectifying element for rectifying in an alternator. The rectifying element has an Enhanced Field Effect Semiconductor Diode (EFESD). The EFESD includes a lateral conducting silicide structure and a field effect junction structure integrating side by side. A rectifier, a generator device, and a powertrain for a vehicle are also provided.

23 Claims, 5 Drawing Sheets

(58) Field of Classification Search
CPC . H01L 2224/29111; H01L 2924/15156; H01L 2224/83447; H01L 2224/83424; H01L 2224/08245; H01L 2224/32245; H01L 2224/33181; H01L 29/456; H01L 29/861; H01L 29/45; H01L 29/4933; H01L 29/7391; H01L 24/01; H02M 7/217

See application file for complete search history.

(56) References Cited

U.S. PATENT DOCUMENTS

| | | | |
|---|---|---|---|
| 2006/0118814 A1 | 6/2006 | Cai et al. | |
| 2006/0223260 A1* | 10/2006 | Henson | H01L 29/4236 438/243 |
| 2008/0217721 A1* | 9/2008 | Hamerski | H01L 29/88 438/534 |
| 2010/0029048 A1 | 2/2010 | Metzler et al. | |
| 2011/0241113 A1* | 10/2011 | Zuniga | H01L 29/7816 257/343 |
| 2012/0104456 A1* | 5/2012 | Yu | H01L 29/36 257/109 |
| 2012/0212164 A1 | 8/2012 | Terakawa et al. | |
| 2013/0329476 A1* | 12/2013 | Spitz | H01L 29/861 363/127 |
| 2015/0243638 A1* | 8/2015 | Matsuoka | H01L 23/053 257/704 |
| 2015/0333175 A1* | 11/2015 | Kiyosawa | H01L 21/30604 257/77 |
| 2016/0201586 A1* | 7/2016 | Serrano | B60W 30/20 701/111 |
| 2016/0233330 A1 | 8/2016 | Ahlers et al. | |
| 2016/0315184 A1* | 10/2016 | Ishimaru | H01L 25/07 |
| 2016/0322469 A1* | 11/2016 | Bhalla | H01L 29/401 |
| 2017/0259668 A1* | 9/2017 | Nomura | B60K 28/14 |
| 2019/0140474 A1* | 5/2019 | Stoltz | B60K 25/00 |
| 2019/0263382 A1* | 8/2019 | Parsels | F16H 7/12 |

FOREIGN PATENT DOCUMENTS

| | | |
|---|---|---|
| JP | 2008227495 | 9/2008 |
| JP | 2014502425 | 1/2014 |
| KR | 19990071424 | 9/1999 |
| TW | 200901462 | 1/2009 |
| TW | 201419526 | 5/2014 |
| TW | M516229 | 1/2016 |

OTHER PUBLICATIONS

"Office Action of Taiwan Counterpart Application", dated Apr. 23, 2020, p. 1-p. 12.

"Office Action of Korea Counterpart Application" with English translation thereof, dated Jul. 30, 2020, p. 1-p. 11.

"Search Report of Europe Counterpart Application", dated Jan. 20, 2020, pp. 1-10.

* cited by examiner

RECTIFIER DEVICE, RECTIFIER, GENERATOR DEVICE, AND POWERTRAIN FOR VEHICLE

CROSS-REFERENCE TO RELATED APPLICATION

This application claims the priority benefits of U.S. provisional application Ser. No. 62/744,138, filed on Oct. 11, 2018, and Taiwan application serial no. 108113456, filed on Apr. 17, 2019. The entirety of each of the above-mentioned patent applications is hereby incorporated by reference herein and made a part of this specification.

BACKGROUND OF THE INVENTION

Field of the Invention

The invention relates to a rectifier device, a rectifier, a generator device, and a powertrain for a vehicle.

Description of Related Art

In general, Low Loss Diodes (LLDs) pursue low reverse bias leakage current and low forward bias conducting resistance. The low loss diodes with press-fit packages for the high-efficiency generators have to combine reliability, structural stability, and heat dissipation ability. However, the chip design of the low loss diodes is the most important key.

The low loss diode chips on the market today have some shortcomings, such as reverse bias leakage current increases with bias voltage, excessive leakage at high temperature (more than 200° C. under 100 mA@20V), the cell density cannot be improved etc. In this case, the overall rectification efficiency of the low loss diode chips will be limited.

SUMMARY OF THE INVENTION

The invention provides a rectifier chip for a vehicle, which has a higher forward current density and a lower reverse leakage current, thereby obtaining a better rectification ability.

The invention provides another rectifier chip for a vehicle, which is designed to effectively increase the cell density, thereby improving a chip rectification efficiency.

The invention provides a rectifier device for a vehicle alternator. The rectifier device includes a rectifying element for rectifying in an alternator. The rectifying element has an Enhanced Field Effect Semiconductor Diode (EFESD). The EFESD includes a body area, a silicide layer, a field effect junction structure, an interconnect layer, a substrate, and a metal layer. The silicide layer includes a lateral conducting silicide structure conducting to the body area. The lateral conducting silicide structure and the field effect junction structure are integrated side by side. The lateral conducting silicide structure provides an uni-polar carrier source when a conduction occurs. The interconnect layer electrically connects the lateral conducting silicide structure and the field effect junction structure, wherein the lateral conducting silicide structure, the field effect junction structure, and the interconnect layer are equal potential, and the interconnect layer is served as an anode of the EFESD. The body area is disposed between the lateral conducting silicide structure and the substrate. The metal layer is disposed under the substrate, and the metal layer is served as a cathode of the EFESD.

The invention provides a rectifier for a vehicle including a base, a lead structure, and a rectifier chip. The base has an accommodating space. The lead structure is disposed on the accommodating space. The rectifier chip is disposed between the base and the lead structure, and electrically contacts the lead structure and the base. The rectifier chip includes the said EFESD.

The invention provides a generator device for a vehicle including a rectifier for rectifying an alternating voltage provided by a generator. The rectifier includes the said EFESD.

The invention provides a powertrain for a vehicle including a generator device having a rectifier for rectifying an alternating voltage provided by a generator. The rectifier includes the said EFESD.

Based on the above, in the present invention, the lateral conducting silicide structure and the field effect junction structure are integrated side-by-side to form the EFESD. In this case, the EFESD of the present embodiment has a higher forward current density and a lower reverse leakage current, namely, it has a better rectification ability. In addition, the EFESD of the present embodiment is able to reduce the area of the body area and effectively increase the cell density, thereby increasing the chip usage area.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF THE EMBODIMENTS

Figure 1:
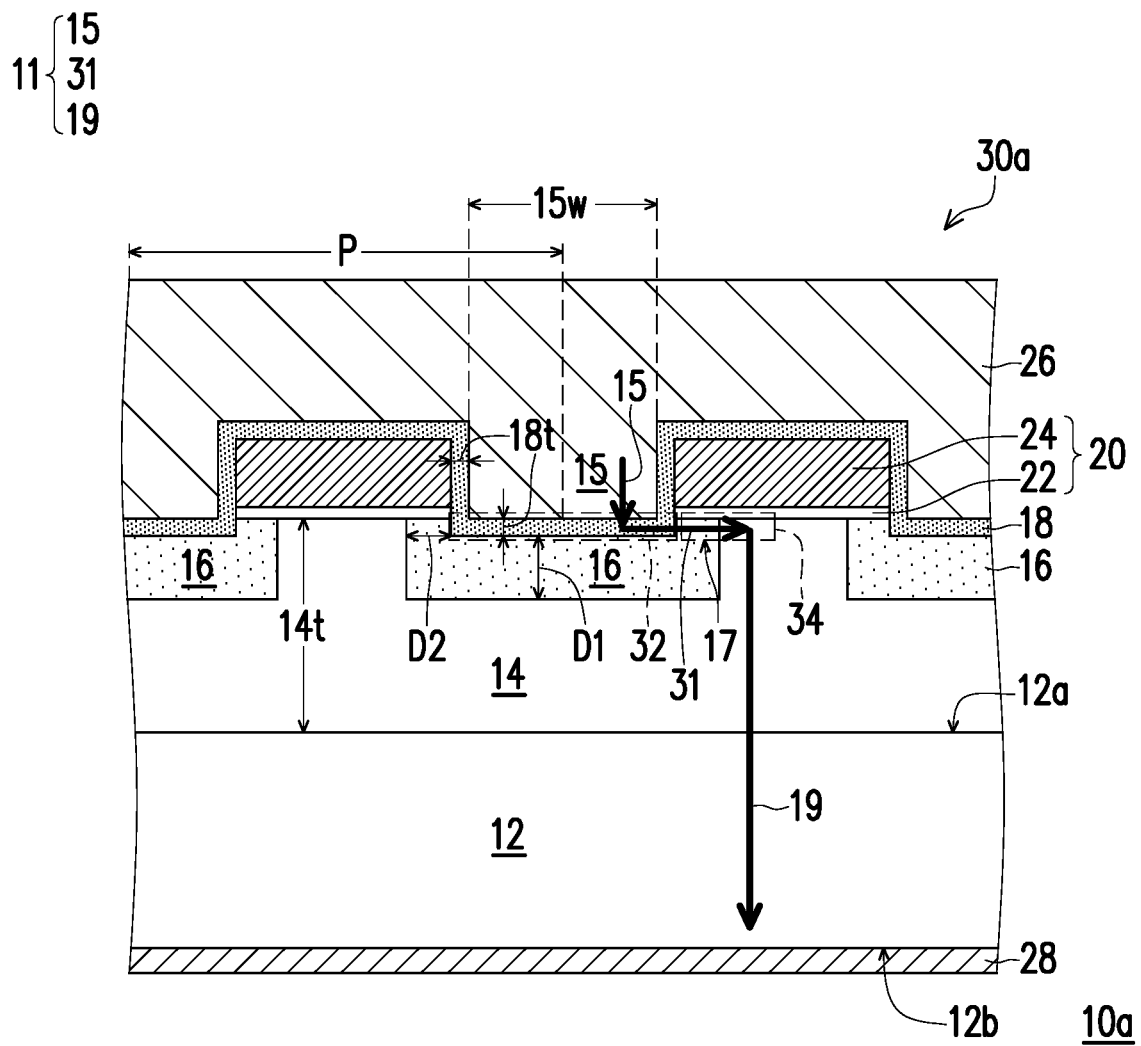
FIG. 1 is a schematic cross-sectional view showing a rectifier device according to a first embodiment of the present invention.

The invention is more comprehensively described with reference to the figures of the present embodiments. However, the invention may also be implemented in various different forms and is not limited to the embodiments in the present specification. The thicknesses of the layers and regions in the figures are enlarged for clarity. The same or similar reference numerals represent the same or similar devices and are not repeated in the following paragraphs.

In the following embodiments, when the first conductivity type is P type, the second conductivity type is N type; when the first conductivity type is N type, the second conductivity type is P type. The P type dopant is, for instance, boron or boron difluoride. The N type dopant is, for instance, phosphorous or arsenic. In the present embodiment, the first conductivity type may be N type, and the second conductivity type may be P type. However, the invention is not limited thereto, and the opposite can also be implemented.

FIG. 1 is a schematic cross-sectional view showing a rectifier device according to a first embodiment of the present invention.

Referring to FIG. 1, the present embodiment provides a rectifier device for a vehicle alternator. The rectifier device includes a rectifying element 10a for rectifying in an alternator. The rectifying element 10a has an Enhanced Field Effect Semiconductor Diode (EFESD) 30a.

Specifically, as shown in FIG. 1, the EFESD 30a includes a substrate 12, an epitaxial layer 14, a plurality of body areas 16, a silicide layer 18, a plurality of gate structures 20, an interconnect layer 26, and a metal layer 28. The substrate 12 has a front side 12a and a back side 12b opposite to each other. In an embodiment, the substrate 12 includes Si, SiC, GaN, or a combination thereof. In the present embodiment, the substrate 12 may be a first conductivity type heavily doped silicon substrate, such as an N-type heavily doped (N+) silicon substrate.

The epitaxial layer 14 is located on the front side 12a of the substrate 12. In an embodiment, the epitaxial layer 14 is an epitaxial layer having the first conductivity type, for example, an N-type lightly doped (N−) epitaxial layer. In another embodiment, a doping concentration of the epitaxial layer 14 may be $1\times10^{16}/cm^3$ to $5\times10^{17}/cm^3$. In alternative embodiments, a thickness 14t of the epitaxial layer 14 may be 2.0 µm to 8.0 µm.

The body areas 16 are located in the epitaxial layer 14, respectively. In an embodiment, the body areas 16 are doped regions having a second conductivity type, such as a P-type doped region. In some embodiments, the substrate 12 and the epitaxial layer 14 have a same conductivity type, and the body areas 16 and the epitaxial layer 14 have different conductivity types. In another embodiment, a doping concentration of the body areas 16 may be $1\times10^{17}/cm^3$ to $5\times10^{17}/cm^3$. As shown in FIG. 1, a bottom surface of the body area 16 is separated from a bottom surface of the silicide layer 18 by a first distance D1; a side surface of the body area 16 is separated from a side surface of the silicide layer 18 by a second distance D2. In alternative embodiments, the first distance D1 may be between 0.5 µm and 2.0 µm; the second distance D2 may be between 0.1 µm and 0.5 µm. In other embodiments, a pitch P is included between adjacent two body areas 16, and the pitch P may be between 2 µm and 3 µm.

The gate structures 20 are located on the epitaxial layer 14 (or the substrate 12) between the body areas 16, and the gate structures 20 also cover portions of the body areas 16. In some embodiments, the gate structures 20 are formed by patterning a gate material layer to form a plurality of gate structures 20 separated from each other. As shown in FIG. 1, the gate structure 20 may include a gate dielectric layer 22 and a gate 24. The gate dielectric layer 22 is located between the gate 24 and the epitaxial layer 14. In some embodiments, the gate dielectric layer 22 includes $SiO_2$, $HfO_2$, $BaTiO_3$, $ZrO_2$, SiON or a combination thereof. The gate dielectric layer 22 has a thickness of 30 Å to 200 Å. However, the present invention is not limited thereto. In other embodiments, the thickness of the gate dielectric layer 22 may be reduced to lower the on-state threshold voltage. The gate 24 may include a polysilicon. The gate 24 has a width of 1.5 µm to 2.0 µm.

The silicide layer 18 covers top surfaces and sidewalls of the gate structures 20 and extends to cover top surfaces of the body areas 16. In some embodiments, the silicide layer 18 includes PtSi, TiSi, NiSi, MoSi, WSi, CoSi, or a combination thereof. The silicide layer 18 may be referred to as a conformal layer with substantially the same thickness. In an embodiment, the silicide layer 18 may have a thickness 18t of 300 Å to 700 Å.

The interconnect layer 26 is located on the gate structures 20 and fills in a space between the adjacent two gate structures 20, so as to form a vertical conducting channel 15. In some embodiments, the interconnect layer 26 includes a metal material, which may be a suitable material such as aluminum, copper, aluminum copper or the like, for example. In another embodiment, a width 15w of the vertical conducting channel 15 may be between 0.4 µm and 0.6 µm. In alternative embodiments, the interconnect layer 26 may be regarded as an anode.

The metal layer 28 is located on the back side 12b of the substrate 12 and is connected to the back side 12b of the substrate 12. In some embodiments, the metal layer 28 includes a metal material, which may be a suitable material such as aluminum, copper, aluminum copper or the like, for example. In alternative embodiments, metal layer 28 may be regarded as a cathode.

It should be noted that, as shown in FIG. 1, the silicide layer 18 being in contact with the body areas 16 may be regarded as a lateral conducting silicide structure 32. The body area 16 under the gate structure 20 may be considered as a channel 17. In some embodiments, the channel 17 is a region defined by a side surface of the lateral conducting silicide structure 32, a side surface of the body area 16, and a bottom surface of the gate dielectric layer 22. In another embodiment, a length of channel 17 may be less than 0.5 µm. Additionally, the body area 16 (or the channel 17) may be in contact with the epitaxial layer 14 to form a field effect junction structure 34. In the present embodiment, the EFESD 30a may include the lateral conducting silicide structure 32 and the field effect junction structure 34 that are integrated side by side. The interconnect layer 26 electrically connects the lateral conducting silicide structure 32 and the field effect junction structure 34, such that the lateral conducting silicide structure 32, the field effect junction structure 34, and the interconnect layer 26 are equal potential. In other embodiments, the connection of the lateral conducting silicide structure 32 to the field effect junction structure 34 may be considered as monolithically integrated.

In an embodiment, the lateral conducting silicide structure 32 may provide an uni-polar carrier source when a conduction occurs. A current path 11 of the EFESD 30a may be from the interconnect layer 26 (i.e., the anode) through the silicide layer 18, the body area 16 (or the channel 17), the epitaxial layer 14, and the substrate 12 to the metal layer 28 (i.e., the cathode). In another embodiment, the current path 11 of the EFESD 30a is bent from the vertical conducting channel 15 into a lateral conducting channel 31 and then bent to another vertical conducting channel 19 to the metal layer 28 (i.e., the cathode). The lateral conducting channel 31 is resulted from an inversion layer generated under the gate dielectric layer 22 when a voltage is applied to the gate 24. In detail, in a case of the forward bias, the inversion layer is formed in the channel 17. The inversion layer is able to bend an energy band and lower a barrier height to reduce the forward voltage. In alternative embodiments, the forward voltage may be between 0.78 V and 0.60 V, or less than 0.60 V.

In some embodiments, the EFESD 30a has a current density of about 500 $A/cm^2$ at a forward voltage of 0.6 V; and has a reverse current density is about 50 $\mu A/cm^2$ at a reverse voltage of −18 V. At a fixed voltage, a ratio of the forward bias current to the reverse bias current (i.e., IF@0.6V/IR@−18V) may be 1×10⁷. In comparison, a commercially available Super Barrier Rectifier (SBR) has a current density of about 300 A/cm² at a forward voltage of 0.6V; and has a reverse current density is about 100 μA/cm² at a reverse voltage of −18 V, namely, a ratio of the forward bias current to the reverse bias current (i.e., IF@0.6V/IR@−18V) of the conventional SBR may be only 3×10⁶. That is, the EFESD 30a of the present embodiment has significant higher ratio of the forward bias current to the reverse bias current at fixed voltage, and thus shows a better rectification ability than the conventional rectifying elements such as the SBR.

In alternative embodiments, when a doping concentration of the body areas 16 of the EFESD 30a is equal to a doping concentration of the body areas of the conventional SBR, the leakage current of the EFESD 30a is less than the leakage current of the SBR at a fixed reverse voltage. In other words, if the EFESD 30a and the SBR are designed to have the same rectification ability, i.e. the same ratio of the forward bias current to the reverse bias current at a fixed voltage, the doping concentration of the body areas 16 of the EFESD 30a of the present embodiment will be lower than that of the SBR. That is to say, in the present embodiment, the body areas having lower doping concentration of the EFESD 30a is able to achieve the same barrier height as the conventional SBR. As the doping concentration of the body areas is reduced, the turn-on voltage on the channel is also reduced. Therefore, the EFESD 30a of the present embodiment has a greater breakdown voltage compared with the conventional rectifying element. In another embodiment, the EFESD 30a may have the breakdown voltage between 20 V and 25 V. In addition, the body areas with the lower doping concentration represents that the present embodiment may reduce the area of the body area to achieve the same rectification ability. As the area of the body areas decreases, the current crowding effect of the EFESD 30a decreases. In this case, the EFESD 30a of the present embodiment can effectively increase the cell density to improve the chip rectification efficiency. In other embodiments, the silicide layer 18 is self-aligned to form in the body areas 16. The term "self-aligned" means that the silicide layer 18 may be aligned to the body areas 16 without additional lithography and etching processes. Therefore, the silicide layer 18 of the present embodiment may be formed without affecting by process variations, which is able to increase the process window and allow more cells to be integrated in a unit area.

In order to demonstrate the achievability of the present invention, the following Example 1 is listed to further illustrate the EFESD of the present invention.

Specifically, a chip of Example 1 includes the EFESD of the present invention (the structure thereof is shown in FIG. 1); and a chip of Comparative Example 1 includes a commercially available SBR. Next, an electrical measurement is performed on the chip of Example 1 and the chip of Comparative Example 1 respectively, and the results of the current and the voltage curve (i.e., IV curve) are shown in FIGS. 4A and 4B.

Figure 4A:
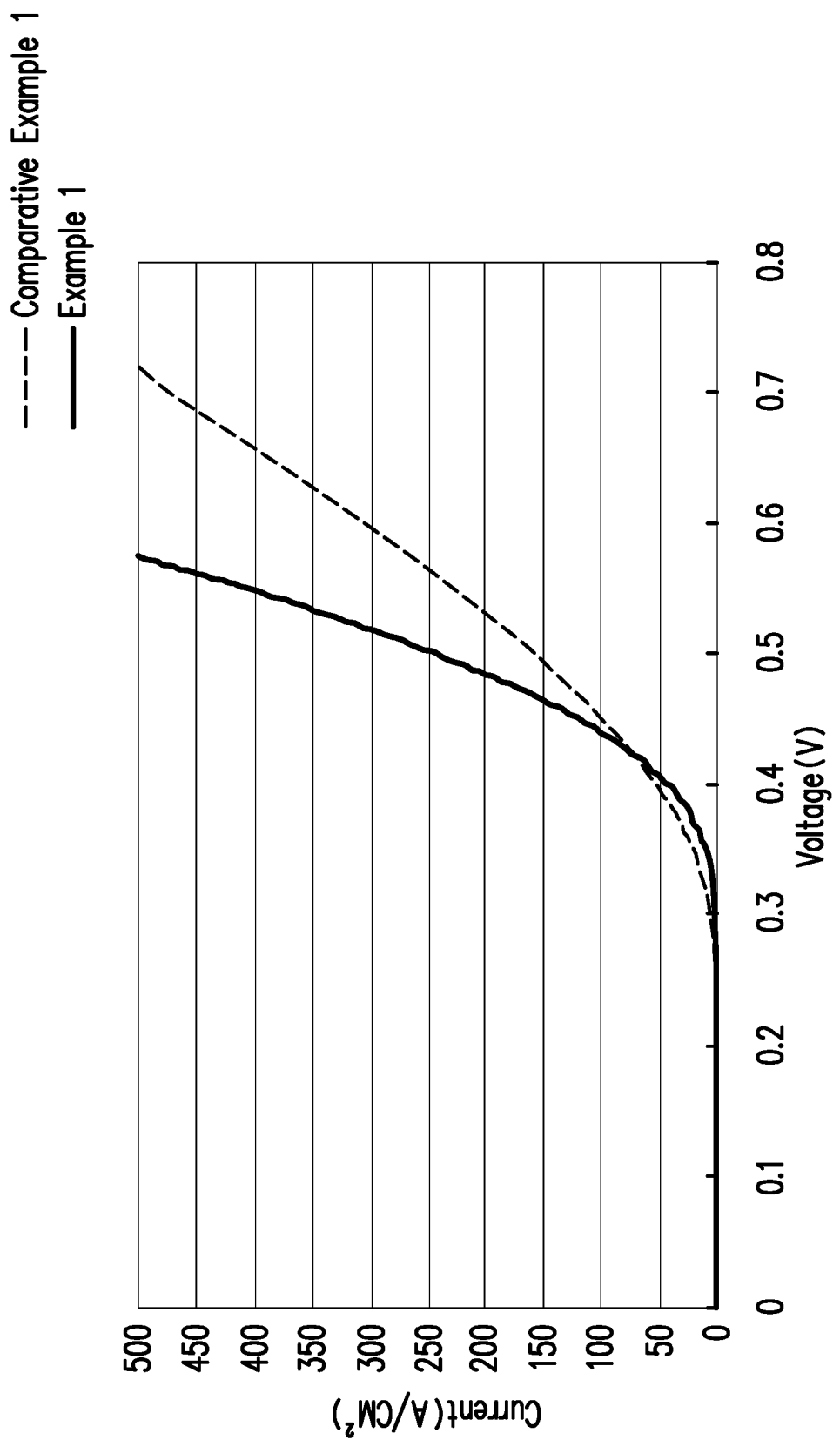
FIG. 4A is a graph showing the relationship between the current and the voltage of Example 1 and Comparative Example 1 at a forward voltage.
Figure 4B:
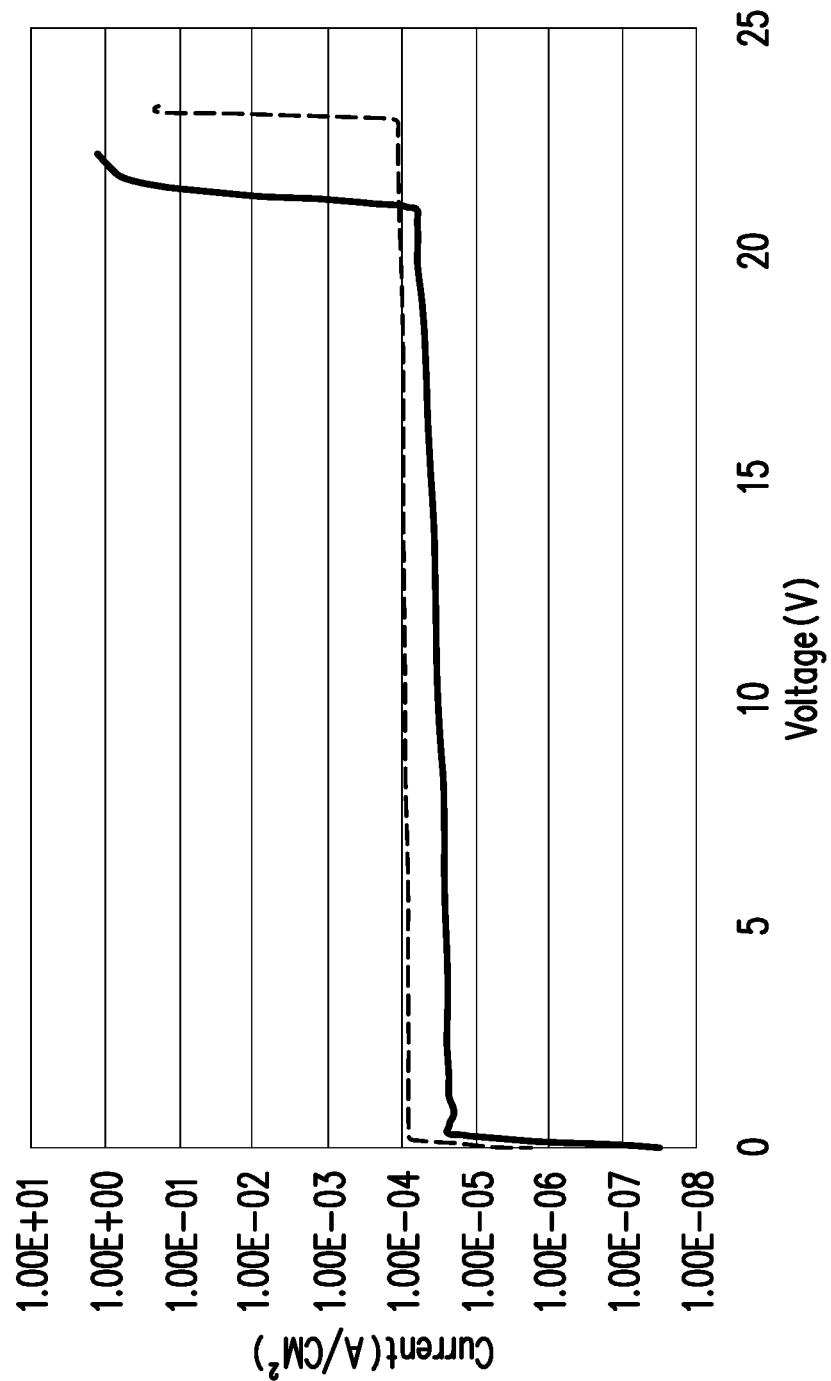
FIG. 4B is a graph showing the relationship between the current and the voltage of Example 1 and Comparative Example 1 at a reverse voltage.

Referring to FIG. 4A, when the chip of Example 1 has the same chip area as the chip of Comparative Example 1, the forward current density of the chip of Example 1 is greater than that of Comparative Example 1 at a forward voltage of more than 0.42 V. On the other hand, as shown in FIG. 4B, when the chip of Example 1 and the chip of Comparative Example 1 have the same chip area, the reverse current density of the chip of Example 1 is less than that of the chip of Comparative Example 1. That is, the chip of Example 1 has a higher forward current density and a lower leakage current. Therefore, the EFESD of the present invention has a better rectification ability than the commercially available SBR.

Figure 2:
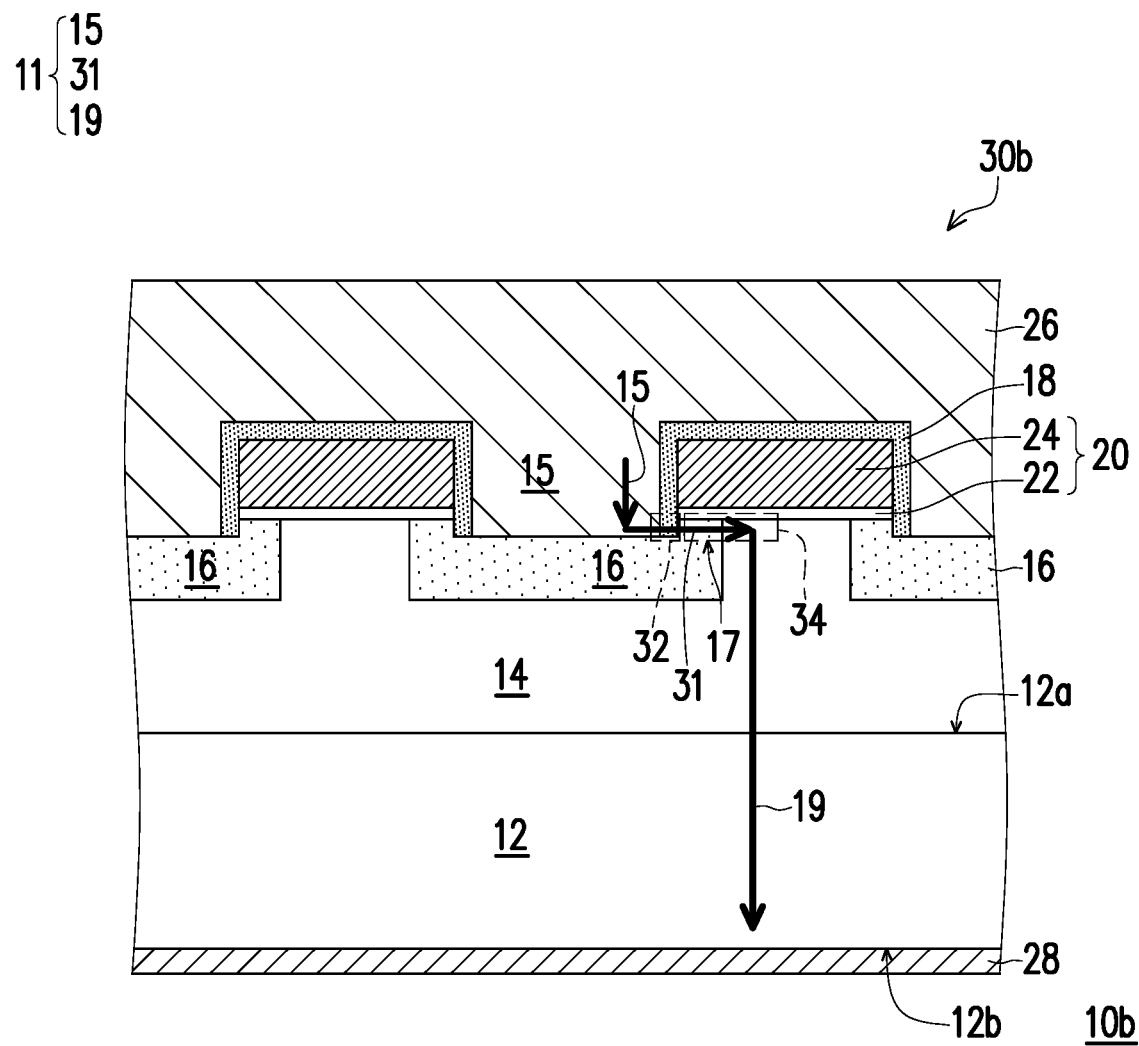
FIG. 2 is a schematic cross-sectional view showing a rectifier device according to a second embodiment of the present invention.

FIG. 2 is a schematic cross-sectional view showing a rectifier device according to a second embodiment of the present invention.

Referring to FIG. 2, basically, the rectifying element 10b of the second embodiment is similar to the rectifying element 10a of the first embodiment. The configuration and materials of the same members have been described in detail in the above embodiments and will not be repeated. The difference therebetween lies that the rectifying element 10b of the second embodiment includes an EFESD 30b. The interconnect layer 26 of the EFESD 30b penetrates through the silicide layer 18 to contact the body areas 16. Specifically, after the silicide layer 18 is formed, a portion of the silicide layer 18 is removed to expose the top surfaces of the body areas 16. The interconnect layer 26 is then formed to fill in the space between the adjacent two gate structures 20, so that the interconnect layer 26 is in contact with the body areas 16.

Figure 3:
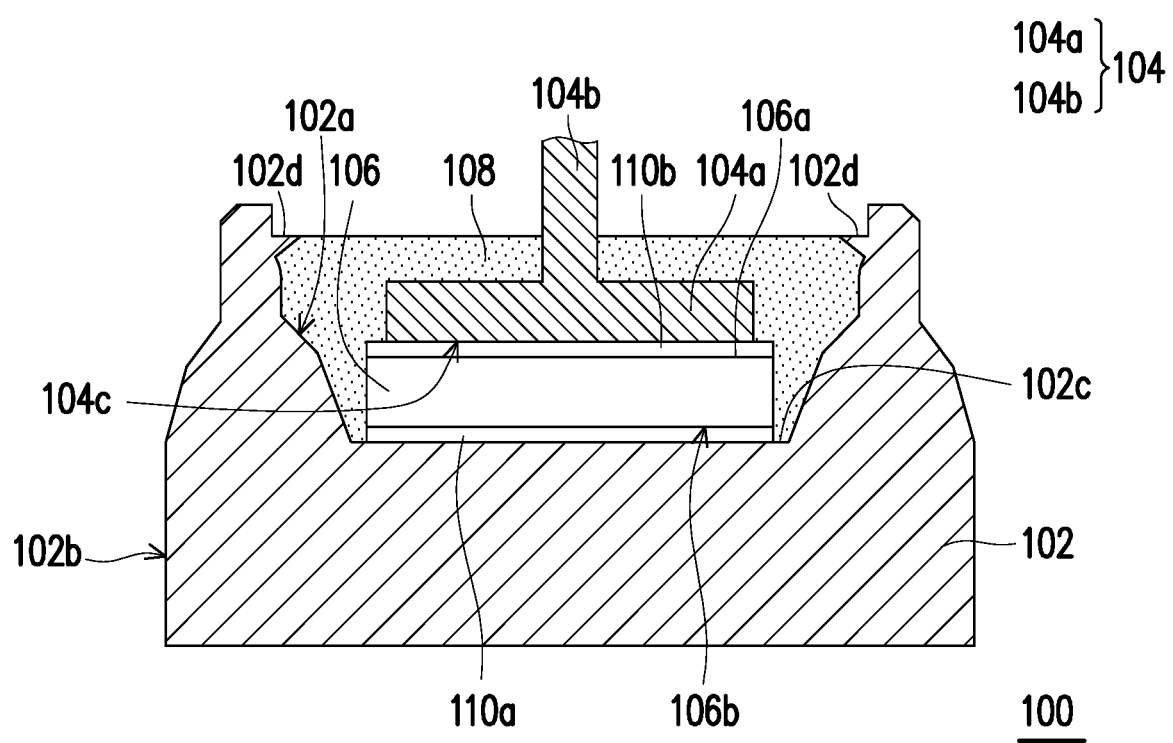
FIG. 3 is a schematic cross-sectional view showing a rectifier according to an embodiment of the present invention.

FIG. 3 is a schematic cross-sectional view showing a rectifier according to an embodiment of the present invention.

Referring to FIG. 3, a rectifier 100 includes a base 102, a lead structure 104, and a rectifier chip 106. The base 102 has an accommodating space 102a. In an embodiment, the base 102 includes copper, aluminum, or an alloy thereof, but the invention is not limited thereto. The lead structure 104 is disposed on the accommodating space 102a. The rectifier chip 106 is disposed in the accommodating space 102a of the base 102 and is in electrical contact with the base 102 and the lead structure 104, respectively. In the present embodiment, the rectifier chip 106 includes any one of the said EFESDs 30a, 30b. The structure and materials of the EFESDs 30a, 30b have been described in detail in the above embodiments and will not be repeated. The base 102 and the lead structure 104 may be connected to external circuits, respectively. In the present embodiment, the rectifier 100 may be disposed, for example, on a vehicle generator for rectifying the alternating current (AC) into direct current (DC) and transmitting it to various electrical devices and batteries in the automotive system.

In the present embodiment, a perimeter 102b of the base 102 is, for example, a circle, a square, or a hexagon, but is not limited thereto, and may be other polygonal or irregular shapes. The accommodating space 102a in the base 102 may be corresponding or not corresponding to the shape of the perimeter 102b, the accommodating space 102a may be square, circular or hexagonal, for example. In another embodiment, the perimeter 102b of the base 102 may also have a gear-like profile for increasing heat dissipation area and for dispersing the stress of the rectifier 100 resulted from mounting the rectifier 100 in the vehicle generator by using the press-fit connection technique, thereby ensuring the rectifier chip 106 in the base 102 is not damaged or defective. The base 102 of the present embodiment may be a copper base, a pure aluminum base or an aluminum alloy base.

In the present embodiment, the lead structure 104 includes a base portion 104a and a lead 104b, wherein the base portion 104a may be in direct contact with a top surface 106a of the rectifier chip 106; alternatively, the base portion 104a may be electrically connected to the rectifier chip 106 via a conductive adhesive layer 110b disposed between the rectifier chip 106 and the lead structure 104. In an embodiment, a shape of a bottom surface 104c of the base portion 104a of the lead structure 104 may or may not correspond to a shape of the rectifier chip 106, such as a square, a circle, or a hexagon. A material of the lead structure 104 may be aluminum, copper or an alloy thereof (such as an aluminum alloy), for example. In another embodiment, an area of the base portion 104a of the lead structure 104 is substantially less than or equal to an area of the bottom 102c of the accommodating space 102a of the base 102.

Referring to FIG. 3, in the present embodiment, a bottom surface 106b of the rectifier chip 106 may be in direct contact with the base 102; alternatively, the bottom surface 106b of the rectifier chip 106 may be electrically connected to the base 102 via the conductive adhesive layer 110a disposed between the rectifier chip 106 and the base 102. In some embodiments, the conductive adhesive layers 110a, 110b may be solders commonly used in the art, such as lead-tin solder.

In addition, the rectifier 100 may also have an encapsulant 108 to encapsulate the rectifier chip 106 and a portion of the lead structure 104 in the accommodating space 102a. The encapsulant 108 may be an epoxy resin, a biphenyl resin, an unsaturated polyester or a ceramic material, for example. In addition, in a case of the encapsulant 108, the wall of the accommodating space 102a may have a locking structure 102d inwardly extending. The locking structure 102d may lock the encapsulant 108, thereby improving the overall package reliability and life time of the rectifier 100. The locking structure 102d may, for example, be a continuous annular structure or a plurality of protrusion structures dispersed on the wall of the accommodating space 102a.

In another embodiment of the present invention, a generator device for a vehicle is provided and including a rectifier for rectifying an alternating voltage provided by a generator. The said rectifier includes any one of the said EFESDs 30a, 30b. In some embodiments of the generator device for the vehicle, the EFESD has a load dump protection ability better than that of the conventional SBR. In other embodiments of the generator device for the vehicle, the EFESD has a power loss lower than that of the conventional SBR. The power loss of the EFESD is lower than the power loss of the conventional SBR by more than 15% under the same chip area and package condition at a forward current of 100 amps (i.e., the forward voltage VF=0.55 V and the forward current IF=100 A). In the alternative embodiments, the said generator device for the vehicle includes a winding motor, a permanent-magnet motor, or a combination thereof.

In other embodiments of the present invention, a powertrain for a vehicle includes a vehicle generator device having a rectifier for rectifying an alternating voltage provided by a generator. The said rectifier includes any one of the said EFESDs 30a, 30b. In alternative embodiments, the powertrain for the vehicle includes an Idle stop start system (ISS), a belt driven starter generator system (BSG), and an integrated starter generator system (ISG), or a combination thereof. That is to say, the rectifier of the present embodiment may be applied not only to a fuel vehicle but also to a hybrid electric vehicle or an electric vehicle.

In summary, in the present invention, the lateral conducting silicide structure and the field effect junction structure are integrated side-by-side to form the EFESD. In the forward bias, the inversion layer is formed in the channel, the inversion layer is able to bend the energy band and lower the barrier height, thereby forming the conduction status. In addition, in the reverse bias, a depletion layer is formed in the channel to close the channel, thereby reducing the leakage current. In the case, the EFESD of the present embodiment has a higher forward current density and a lower leakage current, namely, it has better rectification capability. Further, the EFESD of the present embodiment is able to reduce the area of the body area and effectively increase the cell density, thereby achieving the effects of low conducting resistance and low leakage current.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A rectifier device for a vehicle alternator, the rectifier device comprising: a rectifying element for rectifying in an alternator,
   wherein the rectifying element has an Enhanced Field Effect Semiconductor Diode (EFESD) comprising:
   a body area;
   a silicide layer comprising a lateral conducting silicide structure conducting to the body area;
   a field effect junction structure, wherein the lateral conducting silicide structure and the field effect junction structure are integrated side by side, and the lateral conducting silicide structure provides an uni-polar carrier source when a conduction occurs;
   an interconnect layer, electrically connecting the lateral conducting silicide structure and the field effect junction structure, wherein the lateral conducting silicide structure, the field effect junction structure, and the interconnect layer are equal potential, and the interconnect layer is served as an anode of the EFESD;
   a substrate, wherein the body area is disposed between the lateral conducting silicide structure and the substrate; and
   a metal layer, disposed under the substrate, wherein the metal layer is served as a cathode of the EFESD,
   wherein a first distance between a bottom surface of the body area and a top surface of the body area is between 0.5 μm and 2.0 μm, and a second distance between a side surface of the body area and a side surface of the silicide layer is between 0.1 μm and 0.5 μm,
   wherein the substrate has a front side and a back side opposite to each other;
   wherein the EFESD further comprises:
   an epitaxial layer, disposed on the front side of the substrate, and the body area is disposed in the epitaxial layer;
   a gate, disposed on the epitaxial layer, wherein a vertical conducting channel is included between adjacent two gates and the vertical conducting channel corresponds to the body area; and
   a gate dielectric layer, disposed between the gate and the epitaxial layer, and the silicide layer covers a top surface and a sidewall of the gate and extending between the interconnect layer and the body area,
   wherein a channel is an area defined by a side surface of the lateral conducting silicide structure, a side surface of the body area, and a bottom surface of the gate dielectric layer, a length of the channel is less than 0.5 μm.

2. The rectifier device of claim 1, wherein a current path of the EFESD is from the anode through the silicide layer, the body area, the epitaxial layer, and the substrate to the cathode,
   the current path is bent from the vertical conducting channel into a lateral conducting channel, and the lateral conducting channel is resulted from an inversion layer generated under the gate dielectric layer when a forward bias is applied to the gate.

3. The rectifier device of claim 2, wherein in a case of in a forward bias, the inversion layer is formed in the channel and the inversion layer is able to bend an energy band and lower a barrier height to reduce forward voltage.

4. The rectifier device of claim 1, wherein the substrate and the epitaxial layer have a same conductivity type, and the body area and the epitaxial layer have different conductivity types.

5. The rectifier device of claim 1, wherein the substrate comprises Si, SiC, GaN, or a combination thereof.

6. The rectifier device of claim 1, wherein the gate comprises a polysilicon or a metal.

7. The rectifier device of claim 1, wherein the silicide layer comprises PtSi, TiSi, NiSi, MoSi, WSi, CoSi or a combination thereof.

8. The rectifier device of claim 1, wherein the gate dielectric layer comprises $SiO_2$, $HfO_2$, $BaTiO_3$, $ZrO_2$, SiNO, or a combination thereof.

9. The rectifier device of claim 1, wherein the interconnect layer further penetrates through the silicide layer to contact the body area.

10. The rectifier device of claim 1, wherein a threshold voltage is reduced when a thickness of the gate dielectric layer is decreased.

11. The rectifier device of claim 1, wherein the rectifying element has a conducting state voltage less than 0.6V when a current flows through the EFESD at 500 $A/cm^2$,
a reverse current density of the EFESD is less than 50 $\mu A/cm^2$ at a reverse voltage of −18 V.

12. The rectifier device of claim 1, wherein a turn-on voltage on the channel is reduced when a doping concentration of the body area is decreased.

13. The rectifier device of claim 1, wherein a current crowding effect of the EFESD is reduced to increase a cell density when an area of the body area is decreased and has a shallower depth.

14. The rectifier device of claim 1, wherein the silicide layer is self-aligned with the body area, so that more cells are integrated in a unit area.

15. The rectifier device of claim 1, wherein a leakage current of the EFESD is less than a leakage current of a Super Barrier Rectifier (SBR) at a fixed reverse voltage when a doping concentration of the body area of the EFESD is equal to a doping concentration of a body area of the SBR.

16. The rectifier device of claim 1, wherein a connection of the lateral conducting silicide structure to the field effect junction structure is monolithically integrated.

17. The rectifier device of claim 1, wherein a forward current density of the EFESD is greater than 500 $A/cm^2$ in a forward voltage of 0.6 V.

18. A rectifier for a vehicle, comprising:
a base, having an accommodating space;
a lead structure, disposed on the accommodating space; and
a rectifier chip, disposed between the base and the lead structure, and electrically contacting the lead structure and the base, wherein the rectifier chip comprises an Enhanced Field Effect Semiconductor Diode (EFESD), the EFESD comprises:
a body area;
a silicide layer comprising a lateral conducting silicide structure conducting to the body area;
a field effect junction structure, wherein the lateral conducting silicide structure and the field effect junction structure are integrated side by side, and the lateral conducting silicide structure provides an uni-polar carrier source when a conduction occurs;
an interconnect layer, electrically connecting the lateral conducting silicide structure and the field effect junction structure, wherein the lateral conducting silicide structure, the field effect junction structure, and the interconnect layer are equal potential, and the interconnect layer is served as an anode of the EFESD;
a substrate, wherein the body area is disposed between the lateral conducting silicide structure and the substrate; and
a metal layer, disposed under the substrate, wherein the metal layer is served as a cathode of the EFESD,
wherein a first distance between a bottom surface of the body area and a top surface of the body area is betweenb 0.5 μm and 2.0 μm, and a second distance between a side surface of the body area and a side surface of the silicide layer is between 0.1 and 0.5 μm,
wherein the substrate has a front side and a back side opposite to each other;
wherein the EFESD further comprises:
an epitaxial layer, disposed on the front side of the substrate, and the body area is disposed in the epitaxial layer;
a gate, disposed on the epitaxial layer, wherein a vertical conducting channel is included between adjacent two gates and the vertical conducting channel corresponds to the body area; and
a gate dielectric layer, disposed between the gate and the epitaxial layer, and the silicide layer covers a top surface and a sidewall of the gate and extending between the interconnect layer and the body area,
wherein a channel is an area defined by a side surface of the lateral conducting silicide structure, a side surface of the body area, and a bottom surface of the gate dielectric layer, a length of the channel is less than 0.5 μm.

19. The rectifier of claim 18, further comprising an encapsulant encapsulating the rectifier chip and a portion of the lead structure in the accommodating space.

20. The rectifier of claim 18, further comprising a conductive adhesive layer disposed between the rectifier chip and the base and/or between the rectifier chip and the lead structure.

21. The rectifier of claim 18, wherein the base comprises Cu, Al, or an alloy thereof.

22. A powertrain for a vehicle, comprising:
a generator device having a rectifier for rectifying an alternating voltage provided by a generator, wherein the rectifier comprises the EFESD according to claim 1 an Enhanced Field Effect Semiconductor Diode (EFESD), the EFESD comprises:
a body area;
a silicide layer comprising a lateral conducting silicide structure conducting to the body area;
a field effect junction structure, wherein the lateral conducting silicide structure and the field effect junction structure are integrated side by side, and the lateral conducting silicide structure provides an uni-polar carrier source when a conduction occurs;
an interconnect layer, electrically connecting the lateral conducting silicide structure and the field effect junction structure, wherein the lateral conducting silicide structure, the field effect junction structure, and the interconnect layer are equal potential, and the interconnect layer is served as an anode of the EFESD;
a substrate, wherein the body area is disposed between the lateral conducting silicide structure and the substrate; and
a metal layer, disposed under the substrate, wherein the metal layer is served as a cathode of the EFESD,
wherein a first distance between a bottom surface of the body area and a top surface of the body area is between 0.5 μm and 2.0 μm, and a second distance between a side surface of the body area and a side surface of the silicide layer is between 0.1 um and 0.5 μm,
wherein the substrate has a front side and a back side opposite to each other;
wherein the EFESD further comprises:
an epitaxial layer, disposed on the front side of the substrate, and the body area is disposed in the epitaxial layer;
a gate, disposed on the epitaxial layer, wherein a vertical conducting channel is included between adjacent two gates and the vertical conducting channel corresponds to the body area; and
a gate dielectric layer, disposed between the gate and the epitaxial layer, and the silicide layer covers a top surface and a sidewall of the gate and extending between the interconnect layer and the body area,
wherein a channel is an area defined by a side surface of the lateral conducting silicide structure, a side surface of the body area, and a bottom surface of the gate dielectric layer, a length of the channel is less than 0.5 μm.

23. The powertrain of claim 22, wherein the powertrain comprises an Idle stop start (ISS) system, a belt driven starter generator (BSG) system, an integrated starter generator (ISG) system, or a combination thereof.

* * * * *